United States Patent
Venkatraman et al.

(10) Patent No.: US 6,344,379 B1
(45) Date of Patent: Feb. 5, 2002

(54) SEMICONDUCTOR DEVICE WITH AN UNDULATING BASE REGION AND METHOD THEREFOR

(75) Inventors: Prasad Venkatraman, Gilbert; Ali Salih, Tempe, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/426,108

(22) Filed: Oct. 22, 1999

(51) Int. Cl.⁷ .............................................. H01L 21/337
(52) U.S. Cl. ...................... 438/192; 438/193; 438/195; 438/197; 438/212; 438/268; 438/270; 438/271; 438/284; 257/263; 257/266; 257/270; 257/339; 257/341; 257/342
(58) Field of Search .................. 257/263, 266, 257/270, 328, 329, 334; 438/192, 193, 195, 284, 212, 268, 270, 271, 156, 173, 197, 275, 279, 286

(56) References Cited

U.S. PATENT DOCUMENTS

| | | |
|---|---|---|
| 3,895,978 A | 7/1975 | Tarui et al. .................. 148/187 |
| 5,408,118 A | 4/1995 | Yamamoto .................. 257/342 |
| 5,753,942 A | 5/1998 | Seok .......................... 257/133 |
| 6,111,297 A * | 8/2000 | Grimaldi et al. ............ 257/401 |

FOREIGN PATENT DOCUMENTS

| | | |
|---|---|---|
| EP | 782201 | 7/1997 |
| EP | 823735 | 2/1998 |
| EP | 915509 | 5/1999 |
| EP | 961325 | 12/1999 |
| GB | 2033658 | 5/1980 |
| JP | 89864 | 5/1983 |

* cited by examiner

*Primary Examiner*—Olik Chaudhuri
*Assistant Examiner*—Wai-Sing Louie

(57) ABSTRACT

A transistor (30) uses a single continuous base region (40) with an undulating structure. The semiconductor device is an insulated gate field effect transistor having a semiconductor substrate with a plurality of doped base branches, which extend into the semiconductor substrate, form into a single base region for the entire transistor. Each of the plurality of base branches (82) is undulating and of substantially constant width, and each of the base branches undulates in-phase with the immediately adjacent base branches. A continuous gate layer (34) overlies the semiconductor substrate and is self-aligned to the plurality of base branches. The undulating structure of the base region improves channel density, and thus lowers on-resistance, and the use of a single base region ensures that all portions of the base region throughout the device will be at a substantially constant electric potential.

20 Claims, 6 Drawing Sheets

SEMICONDUCTOR DEVICE WITH AN UNDULATING BASE REGION AND METHOD THEREFOR

RELATED APPLICATIONS

This application is related to the U.S. application titled SEMICONDUCTOR DEVICE WITH A SINGLE BASE REGION AND METHOD THEREFOR, Ser. No. 09/425,623, by Prasad Venkatraman, filed of even date herewith, and is subject to a common obligation of assignment with this application.

BACKGROUND OF THE INVENTION

The present invention relates to semiconductor devices in general and, more particularly, to a semiconductor device having an undulating base region and a method of manufacturing such a device.

Vertical insulated gate field effect transistors (IGFETs) are commonly used for power transistor applications, such as anti-lock brake systems, electronic power steering, solid-state relays, and switching power supplies. Such transistors generally have a large number of cells and are preferred because they offer a low on-resistance per unit area, which, for example, benefits battery powered applications. The low on-resistance is largely the result of the relatively high channel density of a cellular design. Channel density is the amount of horizontal channel width within a given area.

FIG. 1 illustrates an example of a typical cellular IGFET layout for a vertical transistor found in the prior art. Device 10 includes a plurality of cells 12 surrounded by a gate layer 14, made of for example polysilicon. Gate layer 14 has straight-sided gate edges 15. Within each cell 12, a base contact region 16 is surrounded by a source region 18. A conventional base region (not shown), which is a doped region for providing a channel region induced and controlled by gate layer 14, is disposed underneath source region 18 and gate edges 15. Each cell 12 has a substantially square or polygonal shape and typical layout dimension of less than a few microns on each side. During the manufacture of such a cellular IGFET, base contact regions 16 are defined by photoresist pillars, which are used to block dopant from entering the area of the semiconductor substrate that provides base contact regions 16, during the implant step used to form source region 18.

One manufacturing problem with a cellular design is that as the dimensions of the cell become smaller, the dimensions of the photoresist pillars also must become smaller such that they approach the limits of the resolution possible with the photolithography methods used to manufacture the device. This makes it difficult to define and form the photoresist pillars. One specific problem resulting from approaching these resolution limits is the tendency of one or more of the pillars to be improperly formed or missing. This leads to base contact regions 16 missing from one or more cells so that the final manufactured device is rejected.

Another manufacturing problem with a cellular design is related to the electrical isolation of the base regions of each cell. All base regions should be at the same electric potential in order to improve the breakdown voltage and unclamped inductive switching (UIS) characteristics of the final device. Each base region is conventionally electrically isolated in an epitaxial layer, and it is necessary that the overlying source electrode interconnect layer (not shown) make good contact to each base region through each corresponding base contact region 16 so that all base regions are at the same potential. However, because of the large number of such base contacts, there is a significant chance that one or more base regions will not be properly contacted. This is especially true when, as discussed above, photoresist pillars are used to form base contact regions 16. Thus, there is often a significant reliability yield loss resulting in the rejection of many final devices from each semiconductor wafer used during manufacture due to the improper formation of one or more base contacts in each device.

An alternative structure that is more manufacturable than a cellular design is a so-called straight or linear-stripe design, in which source stripes are placed within base stripe regions. Such a straight-stripe design reduces the manufacturing difficulty of a cellular design since the longitudinal layout dimension of the stripe is relatively large. However, straight-stripe designs exhibit reduced channel density relative to cellular designs.

Accordingly, a need exists for a power transistor that provides good channel density and good electrical contacts to the base region resulting in a more uniform electric potential and that reduces the manufacturing difficulties associated with forming photoresist pillars or other features of minimum size in a narrow device cell.

DETAILED DESCRIPTION OF THE PREFERRED EMBODIMENT

A semiconductor device, and methods of manufacture and use, are provided having a single base region with an undulating or wavy structure. The undulating structure of the base region improves channel density, and thus lowers on-resistance, and the use of a single base region ensures that all portions of the base region throughout a single transistor device will be at a substantially constant electric potential. In one structure, the base region and the gate layer each have a plurality of fingers or branches that are interleaved as described below.

Another feature of the semiconductor device is the use of masking or photoresist stripes, which are patterned to run across the semiconductor device, during formation of the base contact regions of the device. The photoresist stripes preferably have a long stripe-like shape, which have a relatively long longitudinal dimension, and are not subject to the manufacturing problems associated with known photoresist pillar approaches.

The semiconductor device is generally useful and applicable to many insulated gate transistors or devices including, without limitation, power IGBTs and IGFETs and MOS-controlled thyristors. Some of the applications for such devices include, for example, power transistor applications such as anti-lock brake systems, electronic power steering, solid-state relays, switching power supplies, and synchronous rectifiers.

Several features of the semiconductor device are described below with reference to specific embodiments as illustrated in the figures listed above. The features in the figures are not drawn to scale and may differ dramatically in relative proportions for purposes of illustration. It should be noted that although an n-channel device is described below, the present invention is also applicable to p-channel devices.

Figure 1:
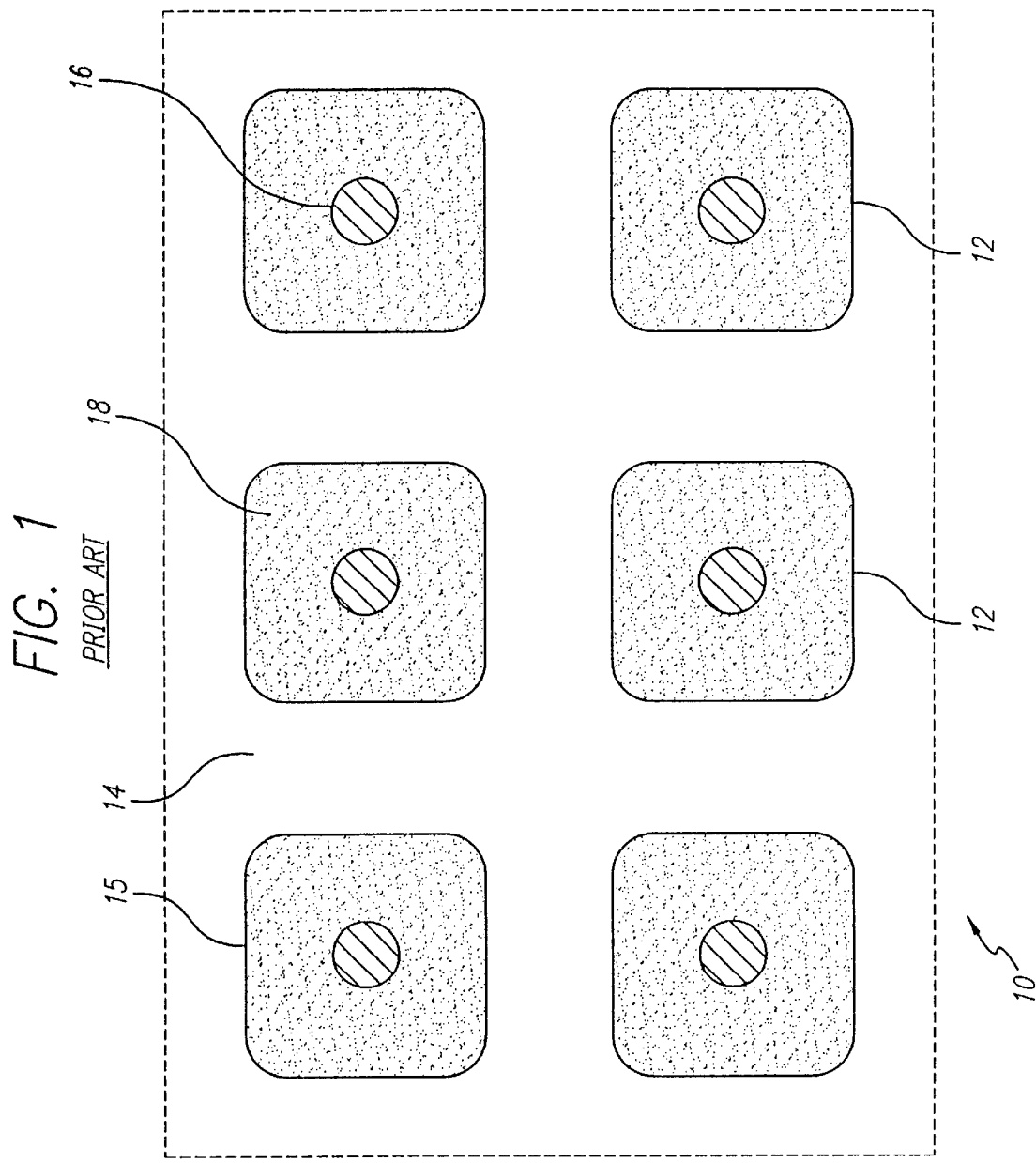
FIG. 1 illustrates a layout view of a known vertical transistor having a cellular design.
Figure 2:
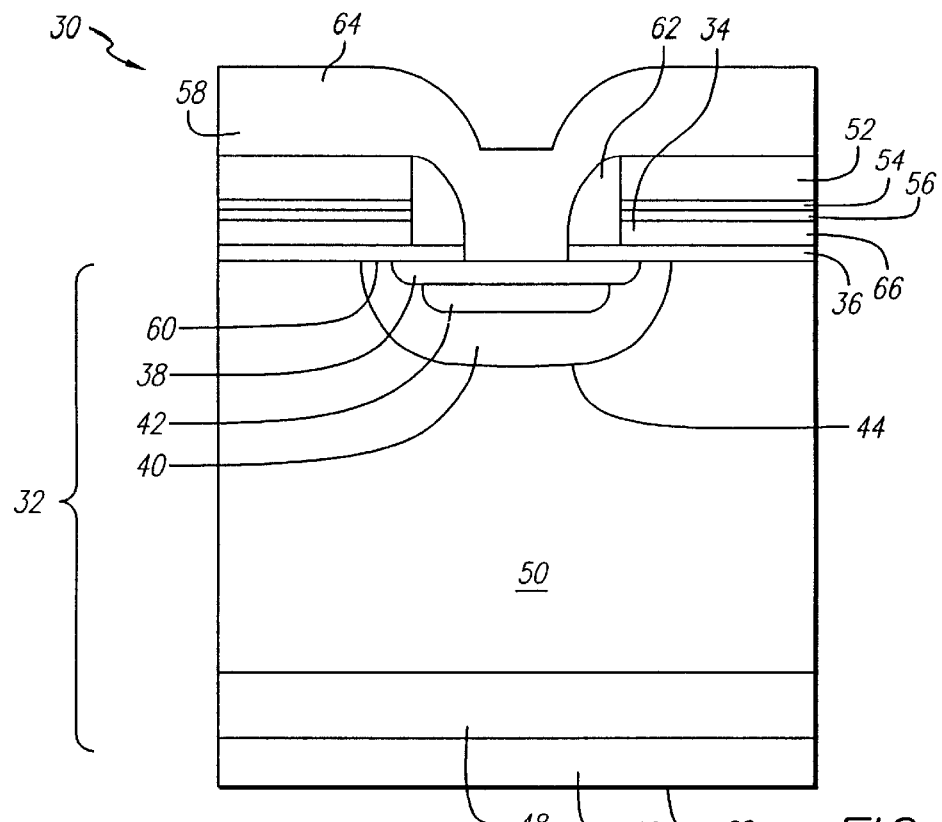
FIG. 2 illustrates a cross-sectional view of a power MOS-gated semiconductor device.

FIG. 2 illustrates a cross-sectional view of a vertical IGFET semiconductor transistor or device 30. Semiconductor device 30 is formed in a semiconductor substrate 32 comprising semiconductor body 48 and semiconductor layer 50, for example an epitaxial layer, formed on body 48. It should be noted that in other types of devices semiconductor substrate 32 may simply be a semiconductor wafer. A back conducting layer 46, for example of metal, formed on the back surface of semiconductor substrate 32 provides a drain electrode or terminal 68 for semiconductor device 30. Gate layer 34, for example formed of polysilicon, provides a gate electrode or terminal 66 for semiconductor device 30 and overlies and is electrically separated from semiconductor layer 50 by gate dielectric layer 36, for example formed of oxide. Source region 38, doped region 42, and doped base or well region 40 are formed in semiconductor layer 50. Base region 40 provides channel region 60, which is modulated by the electric potential of gate layer 34 to control current flow through semiconductor device 30. Base region 40 has a rounded bottom 44, but alternatively could have a substantially flat bottom. Doped region 42 is provided for reducing lateral base resistance. It also provides good electrical contact from source electrode layer 58 to base region 40 at base contact points 100 as shown later in FIG. 4.

A base region is a doped region in a semiconductor material that is used to provide a current channel or channel region for a MOS-gated or insulated gate semiconductor transistor, such as a metal oxide semiconductor field effect transistor (MOSFET), an IGFET or an insulated gate bipolar transistor (IGBT). As will be recognized by one of ordinary skill, it should be noted that MOS-gated transistors may include transistors using polysilicon and other gate materials. The current channel is controlled by an overlying gate layer, which is one continuous gate layer or alternatively several distinct gate layers electrically connected in parallel.

An inter-level dielectric (ILD) comprising, for example, oxide layer 52, nitride layer 54, and oxide layer 56 is formed over gate layer 34. Spacer 62, for example a conventional oxide spacer, is used to form doped region 42. Source electrode layer 58, for example formed of metal, provides source electrode or terminal 64 and contacts source region 38. Layer 58 will contact each of the plurality of source regions 38 in semiconductor device 30 as further illustrated in FIG. 3 below.

Source region 38 is a heavily-doped n-type region. Doped region 42 is, for example, a heavily-doped p-type region but generally with a lighter dopant concentration than source region 38, and base region 40 is a more lightly-doped p-type region. Semiconductor layer 50 is a relatively lightly-doped n-type layer, and semiconductor body 48 is, for example, a heavily-doped n-type semiconductor wafer.

Figure 3:
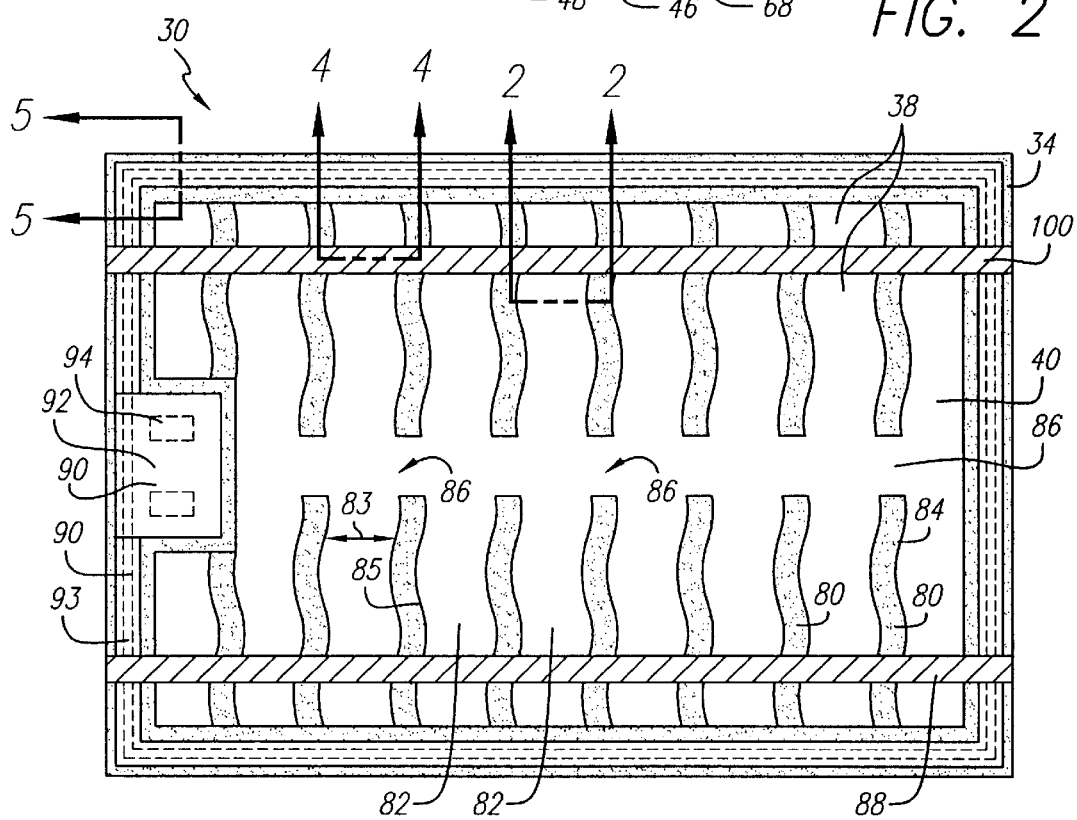
FIG. 3 illustrates a layout view of the power MOS-gated semiconductor device of FIG. 2.

FIG. 3 illustrates a top layout view of semiconductor device 30 of FIG. 2. Common reference numerals are used in the figures for common features. FIG. 3 is a simplified layout view for purposes of illustration and shows a continuous gate layer 34 surrounding the periphery of semiconductor device 30 and comprising a plurality of gate branches or fingers 80 extending inwards from the periphery and into the interior of semiconductor device 30. Each gate branch 80 typically has an undulating edge 84.

An undulating edge is used with respect to a portion of the base region, the gate layer, or the source region of a transistor or device and means a feature that is not straight or not substantially linear on its edges and includes, without limitation, features that are wavy or oscillating or that have a zig-zag or similar repetitive non-linear shape. Also, it should be appreciated that a structure can be undulating even if only one edge is undulating while its other edges are straight. Such a structure would be described herein as an undulating structure by virtue of its undulating edge.

Base region 40 is shown with reference numerals in FIG. 3 for illustration purposes, but it should be noted, as shown in FIG. 2 above, that source regions 38 are generally formed in the top portion of base region 40. Base region 40 extends throughout the full extent of transistor 30 as a single continuous region. Base region 40 includes base branches or stripes 82, and each base branch is undulating and has an undulating edge 85. It should be noted that the single continuous base region 40 corresponds to a single transistor and provides the entire base for the transistor. In other cases, a transistor with a single base or base region may be disposed on a semiconductor chip having one or more other devices that do not use a single base region structure.

The continuity of base region 40 is provided by base regions 86 which are physically integral with base branches 82 as a single doped region underneath source regions 38. Base regions 86 and base branches 82 each constitute a portion of single base region 40. Base region 40 is formed as a single continuous uniformly doped region at one time through the single opening formed in gate layer 34, as will be discussed in more detail below with respect to the manufacture of semiconductor device 30. It should be noted here, however, that a single continuous opening is defined and formed in gate layer 34 to have an overall pattern corresponding to the pattern to be defined for single continuous base region 40. As described below, gate layer 34, along with other layers, acts as a masking layer during formation of single base region 40. Base regions 86 are generally disposed in the interior of semiconductor device 30. In other embodiments, base regions 86 may be disposed near the periphery of semiconductor device 30. Also, gate layer 34 has an outer portion substantially surrounding base region 40 and base regions 86.

A single base region is a base region in which all portions of the base for a transistor are formed into a continuous doped region throughout the full extent of the transistor. It should be noted that there may be one or more other transistors on the same chip as a transistor using a single base region and that these other transistors may not necessarily use a single base region. The continuous doped region forming the single base region is formed using a layout pattern corresponding to a single opening in an overlying gate layer, which is itself used as a masking layer to form the continuously doped base region, all as discussed in more detail below. This layout pattern also incorporates and defines the undulating structure of the base region.

Single base region 40 is uniformly-doped. As used with respect to single base region 40, uniformly-doped means that a typical cross-section of base region 40, such as that shown in FIG. 2, that cuts through base region 40 in substantially the same way and orientation, perpendicular to the lengthwise direction of a base branch 82, and taken periodically along the length of one of base branches 82 will have a substantially identical or similar doping profile in base region 40. In one embodiment, base region 40 is uniformly-doped due to the doping of base region 40 through a single defined opening in a masking layer in a single step and thermal distribution of the dopant to form base region 40 in substantially the same way across the full extent of transistor or device 30. This single defined opening corresponds to a layout mask pattern used to form the masking layer and thus the single base region is considered to be defined in the layout pattern for the transistor as a single continuous region. All portions of base region 40 will receive substantially the same implant dose and be exposed to the same diffusion cycles. An example of one result is that all portions of base region 40 will have substantially the same junction depth.

In comparison to the uniform doping described above, in some prior approaches connecting portions of the base region are formed by an additional mask layer and a separate doping step typically with a much larger implant dose, which renders the channel inactive in the connecting portion and increases the number of processing steps required to manufacture the transistor. It should also be noted that additional implants are subsequently made into portions of base region 40 to form the enhancement and source regions, but the existence of these additional implants is not intended to change the meaning of uniformly-doped as described above.

An aspect of semiconductor device 30 that is related to the continuity of base region 40 and the use of a continuous gate layer 34 is that channel region 60 (see FIG. 2) will be continuous throughout semiconductor device 30. This is true even for portions of base region 40 in which base contact regions 100 are formed because gate layer 34 will still form a channel in underlying semiconductor substrate 32. Gate layer 34 modulates channel region 60 in order to control current flow through semiconductor device 30, and because gate layer 34 has portions that are undulating, corresponding portions of the continuous channel region 60 will also have an undulating shape.

Although not explicitly shown in FIG. 3, it should be noted that a plurality of source regions 38 are formed in the top portion of base region 40, as further illustrated in FIG. 2. Source regions 38 are generally separated by base contact regions 100, which are used to electrically connect source electrode 64 to base region 40. It should be noted in this embodiment that source regions 38 undulate in-phase with the base branch 82 in which each source region is disposed because source regions 38 are formed through substantially the same opening as the base branch 82 is formed.

In-phase refers to adjacent or corresponding portions or branches of an undulating base region, gate layer, or source region. The adjacent branches or portions are undulating in a manner in which the relative peaks and troughs of the undulating edge of one branch or portion substantially correspond to the relative peaks and troughs of the undulating edge of the corresponding adjacent branch or portion, without necessarily requiring that the undulating edges of each branch or portion have the same shape in every case.

Doped region 42 (see FIG. 2) is formed in a top portion of base region 40, but is not shown in FIG. 3 for simplicity of illustration. It should be noted that doped region 42 is a single continuous doped region extending continuously throughout the full extent of base region 40 and provides the advantages of improved UIS performance and reduced lateral base resistance. However, in other embodiments, doped region 42 could be formed as discrete portions.

Figure 4:
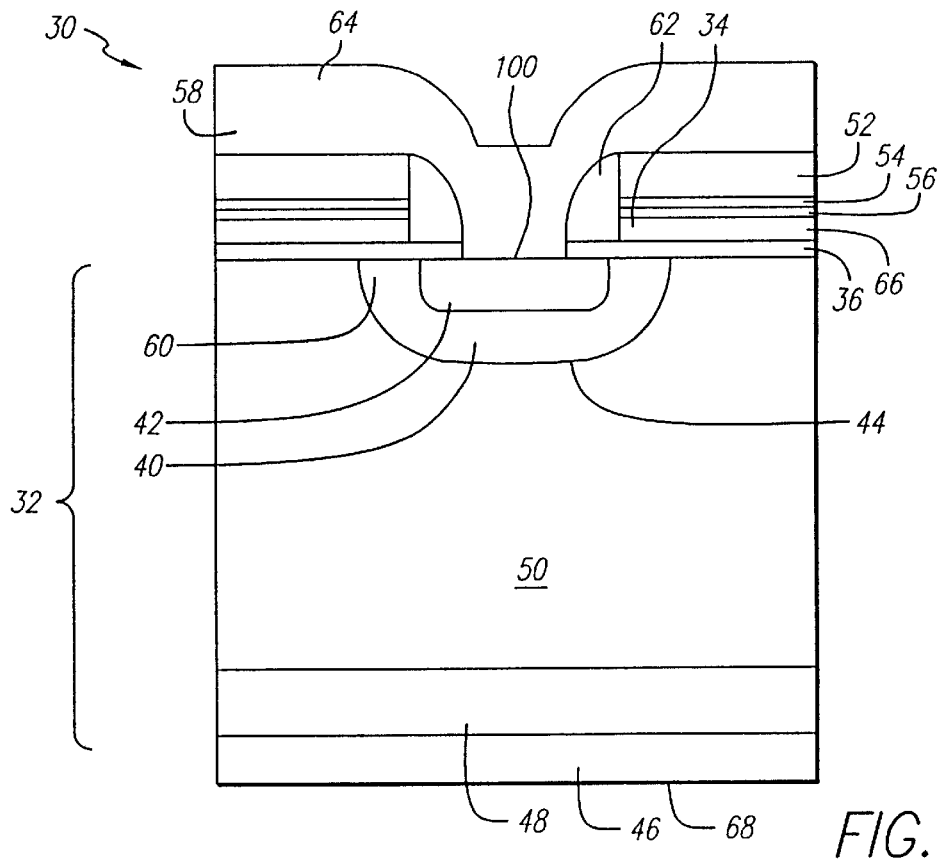
FIG. 4 illustrates another cross-sectional view of the power MOS-gated semiconductor device of FIG. 3 including a base contact region.

As another feature, base contact regions 100 are formed using photoresist masking stripes corresponding to the outlines 88 shown in FIG. 3, which illustrate the positions of the photoresist stripes during an intermediate manufacturing step, as further described below. Masking stripes are formed of photoresist, but as will be recognized by one of skill in the art, other materials could be used to form the masking stripes. The width of the masking stripes is, for example, about 0.2 to 2 microns. FIG. 4 illustrates a cross-sectional view of semiconductor device 30 of FIG. 3 corresponding to a portion of base region 40 over which a photoresist stripe crosses. As shown in FIG. 4, base contact region 100 will be formed in base region 40 due to the absence of source region 38, which is not formed in this portion of base region 40 since source dopant is blocked by the photoresist stripe during implant.

It should be noted that outlines 88 cross over both gate layer 34 and base region 40. However, the actual base contact region 100 corresponds to that portion of outline 88 falling within base region 40. It should also be noted that base contact regions 100 are formed in the top portion of base region 40 and thus do not prevent base region 40 from being a continuous doped region in the underlying semiconductor layer 50. In addition, outlines 88 indicate that photoresist stripes will be formed substantially perpendicular to gate branches 80. In other embodiments, the photoresist stripes could be formed diagonally or otherwise offset from a perpendicular position relative to gate branches 80. Also, the photoresist stripes may be patterned as discrete, separated strips formed across the surface of semiconductor device 30. Further, the photoresist stripes may be patterned as undulating stripes.

Gate branches 80 are interspersed or interleaved with base branches 82. A gate electrode layer 90 makes contact to underlying gate layer 34 using a gate contact 93. Gate electrode layer 90 includes gate pad region 92 having additional gate contacts 94. It should be noted that gate contact 93 is continuous around the perimeter of semiconductor device 30. Alternatively, many discrete contacts could be disposed around semiconductor device 30. Such discrete gate contacts, if used, would be spaced apart by, for example, about 3 to 10 microns.

Each of base branches 82 has a substantially constant width 83, for example, of about 1.5 to 10 microns. It should be noted that the use of a uniform width for base branches 82 helps to more tightly pack device features on semiconductor device 30. Also, each of gate branches 80 has a substantially constant width, for example, of about 3 to 10 microns.

Undulating edges 84 and 85 are shown as regular, repeating waves in FIG. 3, but could be of many other shapes that are non-linear as mentioned above. As an example of repeating wave structures, the wavelength or period of undulating edges 84 or 85 can be, for example, about 5 to 25 microns with an amplitude, which indicates the extent of deviation of an undulating edge from its central axis, of about 0.5 to 5 microns.

Also, it is preferred, but not necessary that base branches 82 or gate branches 80 have an undulating edge. Either or both could have straight edges. In addition, it is not necessary that base region 40 be a single region when using a device with undulating edges 84 and 85. In other embodiments the base branches and/or the gate branches could be undulating in overall shape and have undulating edges in a transistor using a plurality of discrete base branches, for example similar to a cellular design.

Each of base branches 82 generally undulates in-phase with each of its immediately adjacent base branches, and each of gate branches 80 generally undulates in-phase with each of its immediately adjacent gate branches. Also, each of base branches 82 undulates in-phase with the immediately adjacent gate branches 80, which is a result in this embodiment of the self-aligned process used to form semiconductor device 30, as discussed further below.

In general, it is desirable that the lengths of gate branches 80 be kept substantially equal to the extent reasonably permitted by the particular device layout so that the electrical switching time is substantially uniform for each gate branch. This avoids a relatively small number of longer gate branches from negatively impacting the overall switching speed of the device. It should be noted that these equal lengths generally refer to the length of each gate branch from the closest gate contacts provided in the overlying gate electrode layer 90. Since gate electrode layer 90 itself is typically metal, there is no significant switching speed degradation associated with varying lengths from the gate pad region to such closest gate contact of the gate electrode layer.

As an example of a typical final product, semiconductor device 30 will, for a typical die size of about 2.5 mm by 2.5 mm, have about 1,000 to 2,000 base branches, and the width of a base branch will range, for example, between about 1.5 to 10 microns. Also, the base branches will be spaced apart by, for example, about 3 to 10 microns. Base contact regions 100 may be, for example, laterally spaced apart (as viewed from the top layout perspective of FIG. 3) by about 5 to 25 microns.

As mentioned above, gate electrode layer 90, which is formed of metal, substantially surrounds the periphery or perimeter of semiconductor device 30 and includes gate contacts 93 and 94. Gate pad region 92 provides an enlarged portion of gate electrode layer 90 for wire bonding to an external lead. Also, an overlying source electrode layer (not shown) is typically disposed substantially within the boundaries of gate electrode layer 90 and makes contact to source regions 38 and base contact regions 100 at many points across semiconductor device 30 in the manner illustrated in FIG. 2. The source and gate electrode layers are typically a single, continuous metal layer, but in other embodiments could be two or more discrete portions that are electrically connected in parallel using, for example, multiple wire bonds.

FIG. 4 shows the upper portions of base region 40 where a base contact region 100 has been formed. Photoresist stripes corresponding to outlines 88 are used as a mask to block the source dopant implant from entering into the portions of base region 40 covered by the photoresist stripes. The result is the absence of any n-type source dopant in base contact regions 100. Source electrode layer 58 will make contact to base region 40 through doped region 42 at all such points where there is no source region dopant present.

Figure 5:
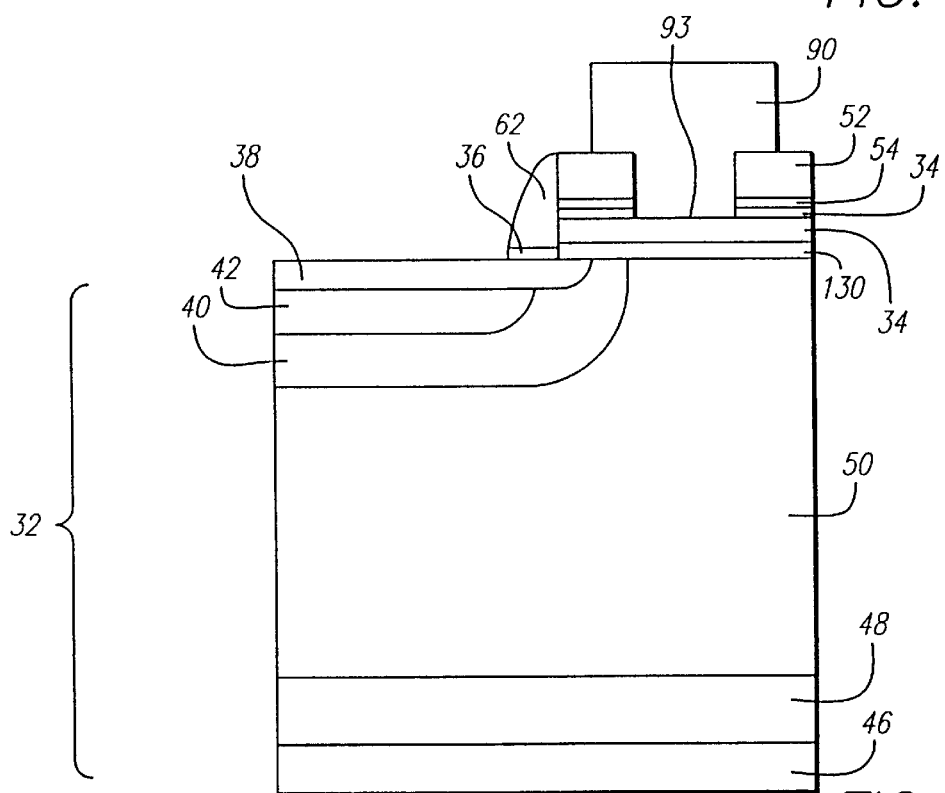
FIG. 5 illustrates yet another cross-sectional view of the power MOS-gated semiconductor device of FIG. 3 including a gate contact.

FIG. 5 illustrates a cross-sectional view of semiconductor device 30 of FIG. 3. Gate contact 93 is provided by gate electrode layer 90 making contact to gate layer 34 through an opening formed in the ILD comprising layers 52–56. A field oxide layer 130 defines the active area of semiconductor device 30.

A specific process is now described that can be used to manufacture the transistor devices. However, one of ordinary skill will recognize that many variations may be made in the specific processing steps described herein. This process flow is described primarily with reference to semiconductor device 30 as shown in FIGS. 2 and 4.

Semiconductor device 30 is formed, for example, by forming semiconductor layer 50 as a n-type lightly-doped epitaxial layer on a heavily-doped n-type semiconductor wafer to provide semiconductor substrate 32. Field oxide layer 130 of about 5,000 to 10,000 angstroms thickness is formed on top of semiconductor layer 50 and then patterned using conventional photoresist and etching steps to define the active area of semiconductor device 30.

Gate dielectric layer 36 is formed on semiconductor layer 50 as a silicon oxide layer of a thickness of about 200–800 angstroms in the active area defined by the patterned field oxide layer 130. Then, gate layer 34 is formed as a polysilicon layer of about 3,000 to 7,000 angstroms thickness and doped with phosphorous to make it conductive. An oxide-nitride-oxide (ONO) stack is formed by oxidizing polysilicon gate layer 34 to form oxide layer 56 to a thickness of about 250 angstroms, depositing nitride layer 54 to a thickness of about 450 angstroms, and depositing oxide layer 52 to a thickness of about 5,000 to 10,000 angstroms.

The ONO stack and polysilicon gate layer 34 are patterned from a defined layout pattern using a photoresist mask and conventional ONO and polysilicon etches to form a single opening for forming base region 40. This opening is a single opening in the entire gate layer so as to define a single continuous base region as discussed above for FIG. 3. Next, a boron ion implant dose of about 3E13 to 5E13 atoms/cm$^2$ and an energy of 40 keV is used to implant boron ions into the epitaxial semiconductor layer 50. It should be noted that base region 40 is self-aligned to gate layer 34 due to the use of this opening in gate layer 34 to define the pattern for base region 40.

In the remaining processing steps of the process which follows, it should be noted that source regions 38 and base contact regions 100 will be formed on different portions of semiconductor device 30 depending on the lateral location of the photoresist stripes discussed above. A thermal drive-in step is used to diffuse and activate the implanted boron ions to form base region 40. An arsenic ion implant at a dose of about 3E15 to 6E15 atoms/cm$^2$ and an energy of 80 keV is used to implant arsenic ions, which will later form source regions 38. Prior to the implant used to begin the formation of source regions 38, photoresist stripes (see outlines 88 in FIG. 3) are patterned across semiconductor device 30. It should be noted that the photoresist stripes will block the source dopant implant so that the base contact region will not have any arsenic ions present. This region corresponds to base contact region 100.

After the arsenic implant step, the photoresist stripes are removed. Next, an oxide layer is formed over the active area of semiconductor device 30, for example by tetraethylorthosilicate (TEOS) deposition to a thickness of about 5,000 to 10,000 angstroms. The oxide layer is etched using a conventional spacer etch to form spacers 62. A boron implant using a dose of about 1E15 to 2E15 atoms/cm$^2$ at an energy of 40 keV is used to implant boron ions into semiconductor layer 50 in a self-aligned manner to spacers 62, which ions will later form doped region 42.

Source regions 38 and doped regions 42 are formed by a thermal drive-in process to diffuse and activate the source and doped region implanted ions. Note that no source region will be formed at the surface of base region 40 in the areas blocked by the photoresist stripes 88, and thus base contact regions 100 are provided for later direct electrical contact by source electrode layer 58 through doped region 42 to base region 40.

It should be noted here that the photoresist stripes 88, since they run across a large extent of semiconductor device 30 and because the width of the stripes can be made sufficiently large so its definition is not critical, greatly improve the manufacturability of base contact regions 100 in contrast to photoresist pillar approaches. This is because the definition and formation of the stripes is well above the minimum resolution range of the photolithography methods used during manufacture. Another advantage of the use of the stripes is that the width of base branches 82, and thus of the overlying source regions 38, can be made much smaller since there is no longer a need to pattern, for example, a photoresist pillar in each of many small cells, as in a cellular design.

Finally, other portions of the ONO stack are patterned using a photoresist mask and etched to form openings for gate contacts 93 and 94 in gate electrode layer 90. A metal layer is deposited to a thickness of about 4 microns and patterned to form source electrode layer 58 and gate electrode layer 90. As seen in FIG. 2, source electrode layer 58 contacts source regions 38. Note also in FIG. 4 that source electrode layer 58 makes contact to base region 40 through doped region 42. A back conducting layer 46 is formed as a metal layer on the back surface of semiconductor body 48 to provide a drain electrode, and a passivation layer is formed and patterned on the front of semiconductor device 30.

Figure 6:
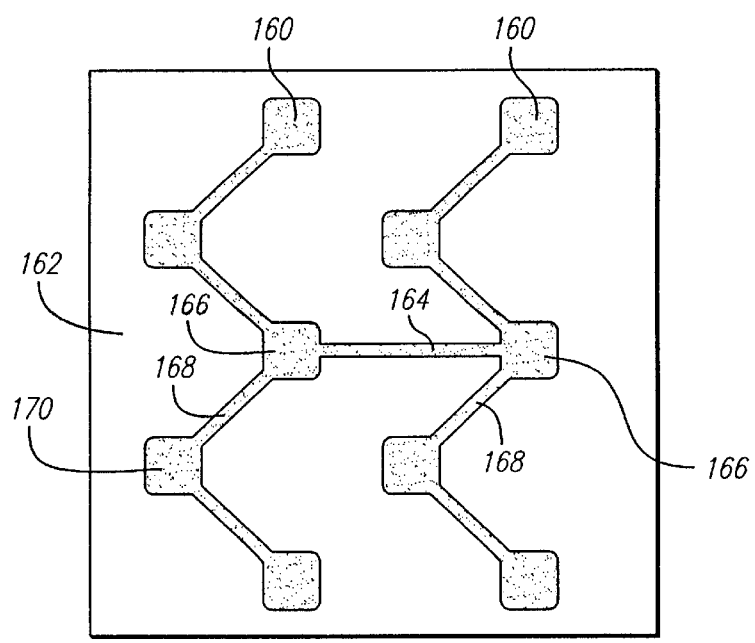
FIG. 6 illustrates an alternative embodiment of an undulating transistor structure.

As discussed above, the undulating shape of base region 40 and gate layer 34 can vary, yet provide the benefit of improved channel density over a conventional linear design. FIG. 6 illustrates an alternative embodiment of an undulating semiconductor device structure. Although not shown in FIG. 6, it should be noted that the photoresist stripes as described above can be used to form base contact regions in this alternative embodiment.

FIG. 6 illustrates a portion of a semiconductor device with a continuous base region comprising base branches 160, which are formed into a single base region by base regions 164. Each of base branches 160 generally has an undulating edge 170 and includes base enlarged portions 166 and base narrower forming portions 168. A gate layer 162, which is a continuous layer, is interspersed with base branches 160. Base enlarged portions 166 are portions of base branches 160 having a relatively larger width, and base narrower forming portions 168 are portions of base branches 160 having a relatively narrow width.

Figure 7:
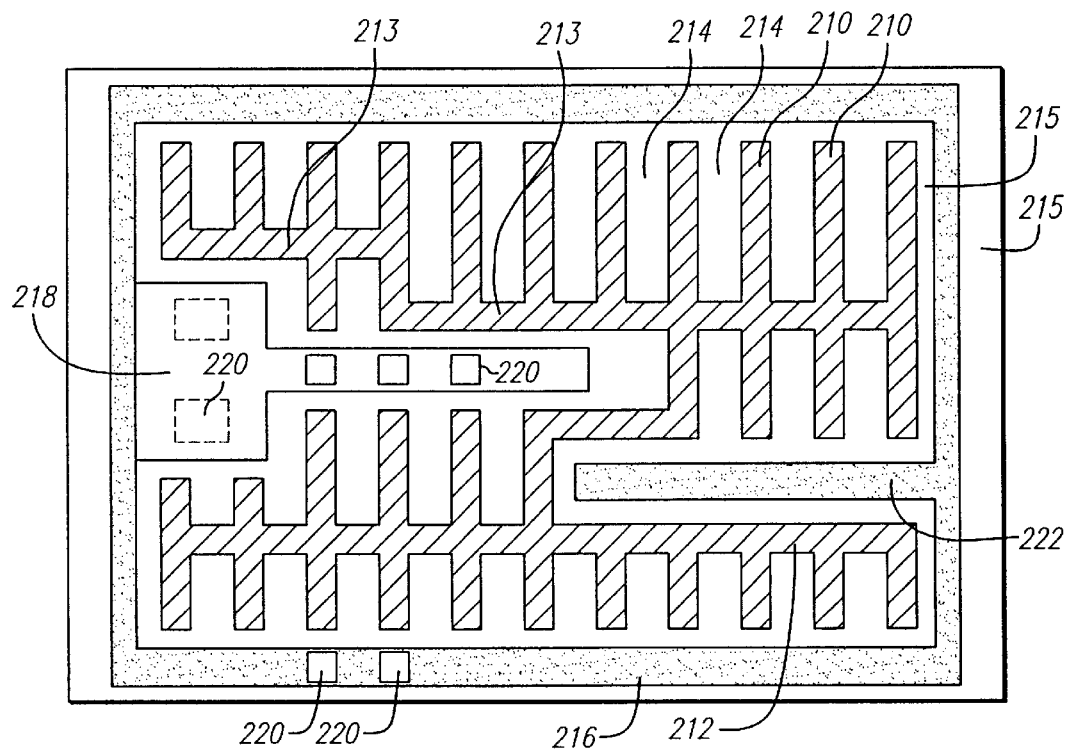
FIGS. 7–9 illustrate alternative embodiments of transistors having a single base region in which the gate layer of each transistor substantially surrounds the single base region.
Figure 8:
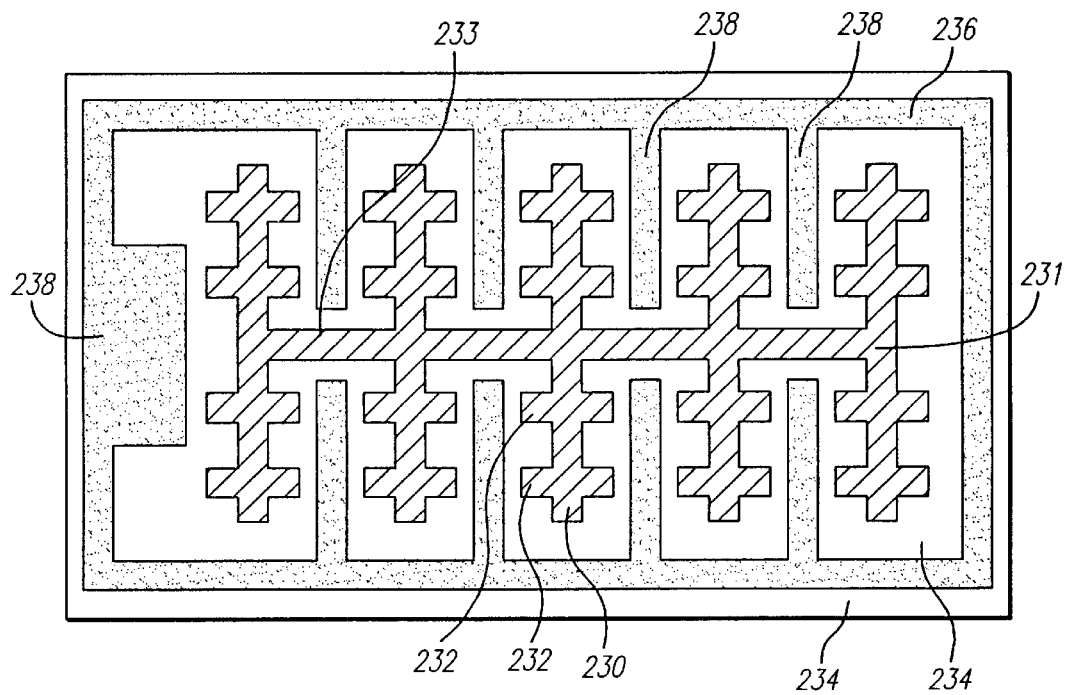
Figure 9:
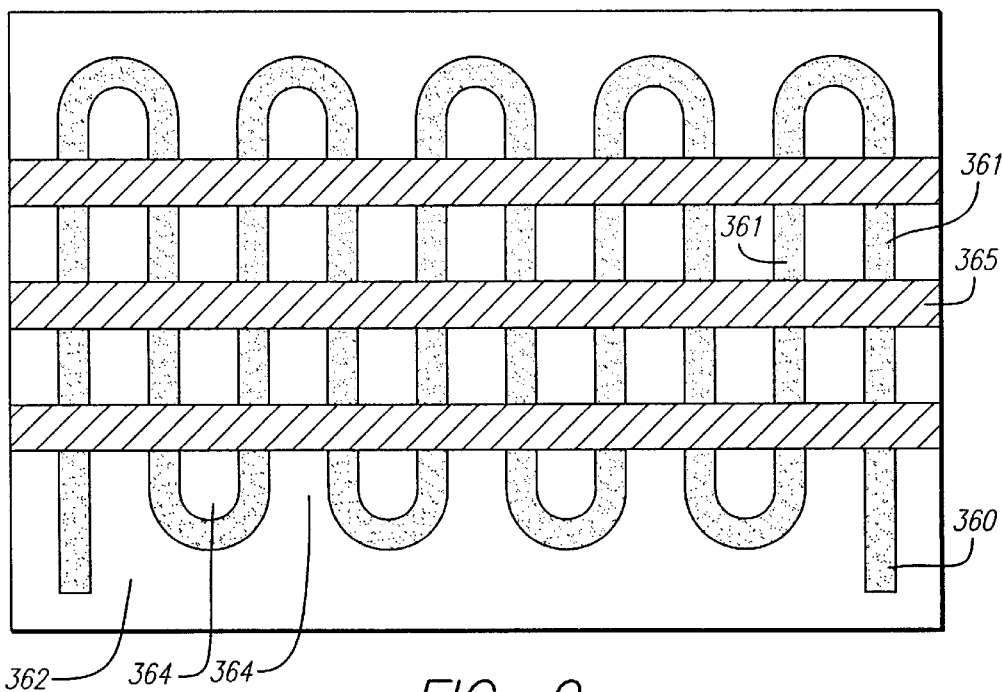

The single continuous base region described above is surrounded by a portion of the gate layer disposed on the periphery of the semiconductor device. FIGS. 7–9 illustrate alternative embodiments of semiconductor devices having a single base region in which the gate layer of each semiconductor device substantially surrounds the single base region. Although generally not shown in the following figures, the illustrated base and gate branches can be formed with undulating edges as described above. Further, photoresist stripes as described above can be used.

FIG. 7 illustrates a semiconductor device with base branches 210 formed into a single base region 212 by base regions 213. A continuous gate layer 215 includes gate branches 214 inter-digitated with base branches 210. Gate electrode layer 216 has a portion substantially surrounding the periphery or perimeter of the device and includes gate pad region 218 disposed on the periphery of the device and internal gate electrode layer branches 222 extending inwards from the peripheral portion of gate electrode layer 216.

It should be noted that continuous gate layer 215 extends underneath gate electrode layer 216, provides a peripheral portion that substantially surrounds single base region 212, and is electrically connected to gate electrode layer 216 by gate contacts 220 disposed at regular intervals throughout gate electrode layer 216. The length of each gate branch 214 can be made substantially equal to make switching times substantially uniform for each gate branch as measured from the nearest gate contact 220, which may be located on the peripheral portion of gate electrode layer 216 or on one of internal electrode layer branches 222. Alternately, each gate branch 214 can be made different lengths to accommodate the layout.

FIG. 8 illustrates a semiconductor device with a single base region 231 comprising primary base branches 230 formed by base regions 233 and having secondary branches 232 further extending from primary branches 230. Gate layer 234 surrounds base region 231. Gate electrode layer 236 includes gate pad region 238 and internal gate electrode layer branches 238.

It should be noted that the base branches of the single base region may have other shapes in alternative embodiments. For example, the branches could be U-shaped or L-shaped. Also, the base branches could run diagonally from the four corners of the device or different sets of base branches could run substantially perpendicular to one another.

FIG. 9 illustrates a semiconductor device with a single base region 360 including base branches 361. Gate layer 362 is continuous and includes gate branches 364 extending inwards from opposite portions of gate layer 362 and interleaved with gate branches 364 from the opposing side. Photoresist stripe outlines 365 are shown similarly as above.

Figure 10:
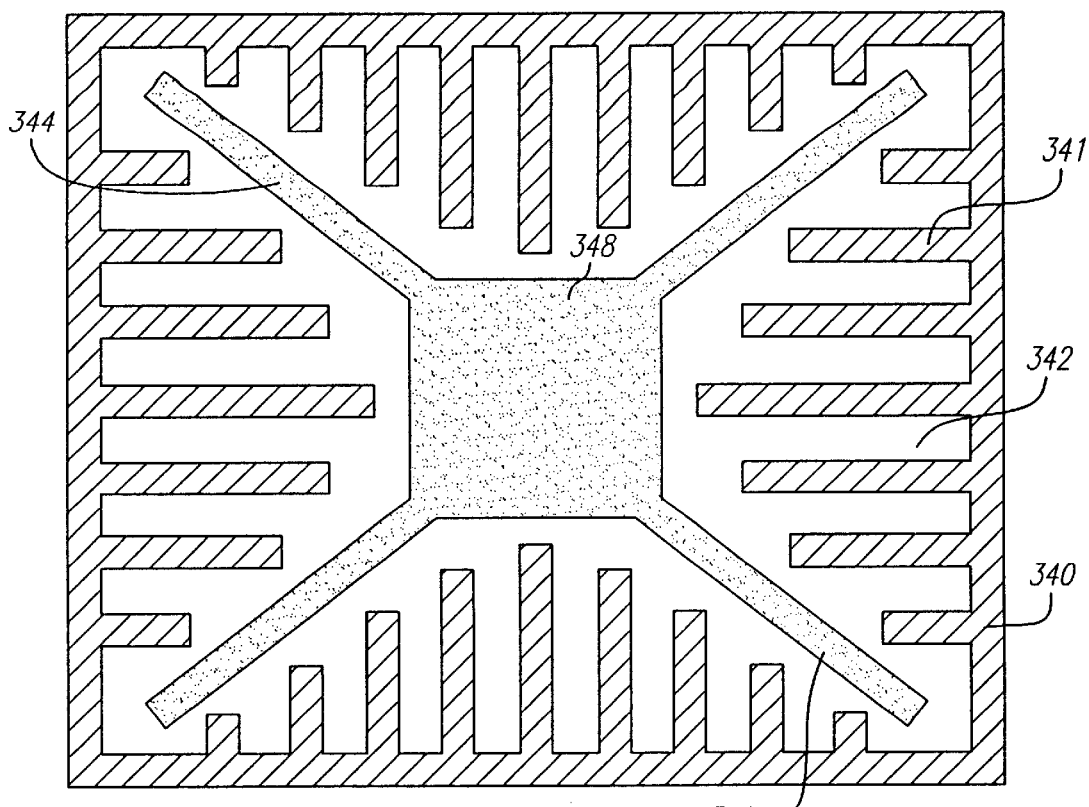
FIGS. 10 and 11 illustrate alternative embodiments of transistors having a single base region in which a peripheral portion of the single base region substantially surrounds the gate layer of the transistor.
Figure 11:
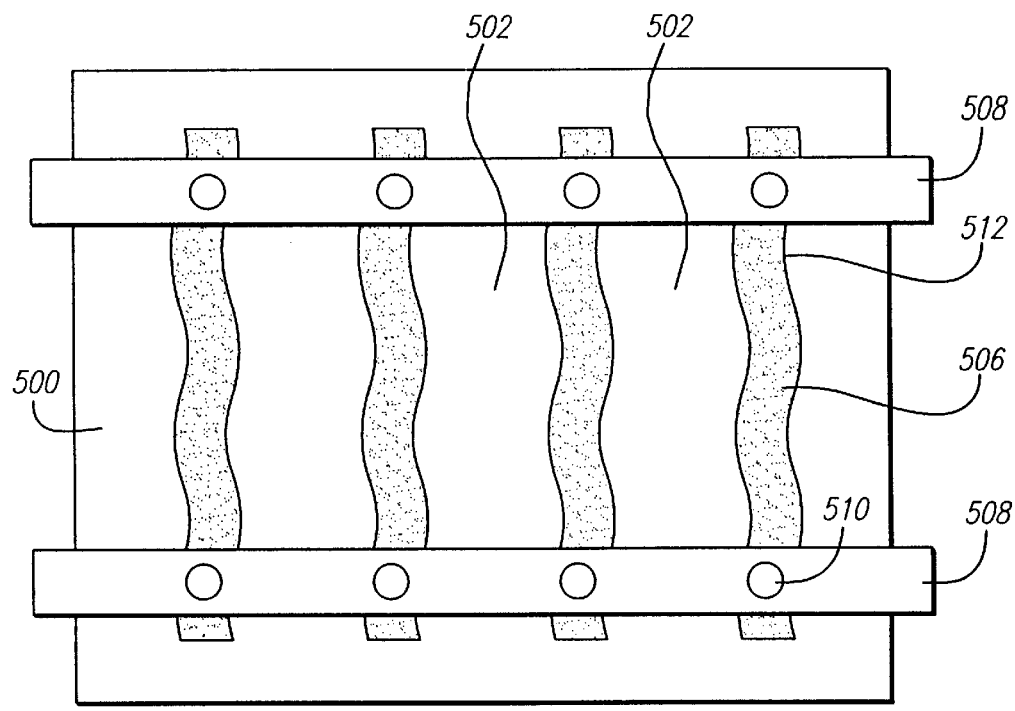

The single continuous base region described above is generally surrounded by a portion of the gate layer disposed on the periphery of the semiconductor device. In an alternative approach, the perimeter of the semiconductor device can be substantially surrounded by an outer portion of the base region. FIGS. 10 and 11 illustrate alternative embodiments of a semiconductor device having a single base region in which a peripheral portion of the base region substantially surrounds the gate layer of the semiconductor device. Photoresist stripes as described above can be used with these embodiments.

FIG. 10 illustrates a semiconductor device with a single base region 340 including base branches 341. Gate layer 342 is continuous, and gate electrode layer 344 includes diagonal electrode branches 346 extending outward from a gate pad region 348, which is disposed in the interior region of the device.

FIG. 11 illustrates a semiconductor device with a single base region 500 including base branches 502. The gate layer includes discrete gate branches 506. Base region 500 surrounds the periphery of gate branches 506. Each of base branches 502 and gate branches 506 has a substantially constant width, and all gate branches 506 are electrically connected in parallel to gate electrode layer branches 508 using gate contacts 510. Source regions (not shown) are formed similarly as described above in a top portion of base region 500 between branches 508.

The alternative embodiments for a semiconductor device with a peripheral base region as described above can be manufactured using the general process flow described previously except as follows. Specifically, for the device of FIG. 11 in order to prevent gate electrode layer branches 508 from shorting to the gate and source regions of the device it is necessary to provide an insulating layer, for example an oxide layer, to cover the base region underneath the gate electrode. The insulating layer can be formed, for example, by using a photoresist mask during the spacer etch process described above in order to leave a portion of an insulating layer over those portions of the base region directly underneath gate electrode layer branches 508.

The use of masking or photoresist stripes to form base contact regions has been described above with respect to semiconductor devices having a single base region. However, such photoresist stripes are also useful in manufacturing other semiconductor devices that may not have a single base region. For example, the photoresist stripes may be useful with a cellular design. Specifically, photoresist stripes can be used to form base contact regions in the many cells in a cellular design in the surface area of the cell crossed over and defined by the photoresist stripes. Also, the photoresist stripes may be undulating in shape rather than straight.

In summary, a semiconductor device having a single continuous uniformly doped base region with an undulating structure and methods therefor have been disclosed by way of numerous embodiments. The base region is formed at one time by one step in the manufacturing process. The semiconductor device provides the advantages of improved channel density, breakdown voltage, and unclamped inductive switching characteristics. Further, the device exhibits good electrical contacts to the base region resulting in a more uniform electric potential in the base region and avoids the manufacturing problems of forming photoresist features of minimum size by using photoresist stripes to form base contact regions.

What is claimed is:

1. A method of providing a semiconductor device, comprising:

providing a substrate; and providing a single, continuous base region disposed in the substrate, wherein a first portion of the base region is undulating and has a substantially constant width.

2. The method of claim 1 wherein the first portion of the base region includes providing a plurality of branches wherein at least one of the branches has a substantially constant width.

3. The method of claim 1 wherein the base region is a single uniformly-doped region.

4. The method of claim 1 wherein providing the base region includes defining the base region as a single continuous region using a masking layer.

5. The method of claim 1 further including providing a continuous gate layer disposed overlying the substrate.

6. The method of claim 1 further including forming at least one base contact region in the base region using a masking stripe.

7. The method of claim 1 further including forming at least one source region in the base region, wherein the source region and the first portion of the base region undulate in-phase.

8. The method of claim 1 further including providing a gate layer disposed overlying the substrate, wherein the gate layer includes at least one branch that undulates in-phase with the first portion of the base region.

9. The method of claim 1 wherein providing the base region includes forming the base region by doping through a masking layer having a single opening.

10. The method of claim 1 wherein the base region includes first and second adjacent branches that undulate in-phase.

11. A method of providing a vertical transistor device having reduced resistance, the method comprising:

providing a single, continuous base region disposed in a substrate, wherein a first portion of the base region is undulating and has a substantially constant width; and creating a channel region within the single, continuous base region during operation of the vertical transistor device.

12. The method of claim 11 wherein the first portion of the base region includes providing a plurality of branches wherein at least one of the branches has a substantially constant width.

13. The method of claim 11 wherein the base region is a single uniformly-doped region.

14. The method of claim 11 wherein providing the base region includes defining the base region as a single continuous region using a masking layer.

15. The method of claim 11 further including providing a continuous gate layer disposed overlying the substrate.

16. The method of claim 11 further including forming at least one base contact region in the base region using a masking stripe.

17. The method of claim 11 further including forming at least one source region in the base region, wherein the source region and the first portion of the base region undulate inphase.

18. The method of claim 11 further including providing a gate layer disposed overlying the substrate, wherein the gate layer includes at least one branch that undulates in-phase with the first portion of the base region.

19. The method of claim 11 wherein providing the base region includes forming the base region by doping through a masking layer having a single opening.

20. The method of claim 11 wherein the base region includes first and second adjacent branches that undulate in-phase.

* * * * *